United States Patent
Cheng et al.

(10) Patent No.: US 8,471,296 B2
(45) Date of Patent: Jun. 25, 2013

(54) FINFET FUSE WITH ENHANCED CURRENT CROWDING

(75) Inventors: Kangguo Cheng, Guilderland, NY (US); Louis C. Hsu, Fishkill, NY (US); William R. Tonti, Essex Junction, VT (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 306 days.

(21) Appl. No.: 13/011,215

(22) Filed: Jan. 21, 2011

(65) Prior Publication Data
US 2012/0187528 A1    Jul. 26, 2012

(51) Int. Cl.
*H01L 23/52*    (2006.01)
*H01L 21/326*    (2006.01)

(52) U.S. Cl.
USPC .............. 257/209; 257/529; 257/E23.149; 257/E21.592; 438/132; 438/281; 438/601

(58) Field of Classification Search
USPC ... 257/209, 529, E23.149, E21.592; 438/132, 438/281, 601
See application file for complete search history.

(56) References Cited

U.S. PATENT DOCUMENTS

| | | | |
|---|---|---|---|
| 5,291,434 A | 3/1994 | Kowalski | |
| 5,638,250 A | 6/1997 | Oravala | |
| 6,015,082 A | 1/2000 | Kivilahti | |
| 6,193,139 B1 | 2/2001 | Kivilahti | |
| 6,275,135 B1 | 8/2001 | Hibayashi et al. | |
| 6,335,852 B1 | 1/2002 | Nimmo | |
| 6,349,424 B1 | 2/2002 | Stradinger et al. | |
| 6,452,248 B1 | 9/2002 | Le | |
| 6,459,353 B1 | 10/2002 | Mattlar et al. | |
| 6,479,780 B2 | 11/2002 | Virtanen et al. | |
| 6,548,943 B2 | 4/2003 | Kaitila et al. | |
| 6,667,537 B1 | 12/2003 | Koike et al. | |
| 6,897,543 B1 | 5/2005 | Huang et al. | |
| 6,911,360 B2 | 6/2005 | Li et al. | |
| 7,087,499 B2 * | 8/2006 | Rankin et al. | 438/412 |
| 7,175,388 B2 | 2/2007 | Labbe et al. | |
| 7,193,292 B2 | 3/2007 | Liaw | |
| 7,361,968 B2 | 4/2008 | Chuang et al. | |
| 7,573,118 B2 | 8/2009 | Kushida | |
| 7,709,928 B2 | 5/2010 | Kim et al. | |
| 7,745,266 B2 | 6/2010 | Bae | |

(Continued)

OTHER PUBLICATIONS

U.S. Appl. No. 12/471,872, filed May 26, 2009, IBM Disclosure Nos. FIS820080363 and FIS820080262 (Merged).

*Primary Examiner* — Minh-Loan T Tran
(74) *Attorney, Agent, or Firm* — Gibb & Riley, LLC; Richard M. Kotulak, Esq.

(57) ABSTRACT

A method forms an eFuse structure that has a pair of adjacent semiconducting fins projecting from the planar surface of a substrate (in a direction perpendicular to the planar surface). The fins have planar sidewalls (perpendicular to the planar surface of the substrate) and planar tops (parallel to the planar surface of the substrate). The tops are positioned at distal ends of the fins relative to the substrate. An insulating layer covers the tops and the sidewalls of the fins and covers an intervening substrate portion of the planar surface of the substrate located between the fins. A metal layer covers the insulating layer. A pair of conductive contacts are connected to the metal layer at locations where the metal layer is adjacent the top of the fins.

24 Claims, 4 Drawing Sheets

U.S. PATENT DOCUMENTS

| | | |
|---|---|---|
| 7,777,296 B2 | 8/2010 | Yang et al. |
| 8,148,249 B2 * | 4/2012 | Lin et al. .................. 438/591 |
| 2002/0053554 A1 | 5/2002 | Virtanen et al. |
| 2002/0149300 A1 | 10/2002 | Kaitila et al. |
| 2003/0075307 A1 | 4/2003 | Stoynoff et al. |
| 2007/0029576 A1 * | 2/2007 | Nowak et al. ................ 257/209 |
| 2007/0210890 A1 | 9/2007 | Hsu et al. |
| 2010/0301417 A1 | 12/2010 | Cheng et al. |

* cited by examiner

FINFET FUSE WITH ENHANCED CURRENT CROWDING

BACKGROUND

The present invention relates to integrated circuit devices, and more specifically, to an eFuse that has adjacent anode and cathode fin structures, with an intervening metal link layer.

Fuses are utilized within integrated circuit devices for a variety of purposes, such as to program certain functionality into the device, to enable or disable various devices, etc. Such structures can actually make or break electrical connections (such as in physically destroyable fuses or anti-fuses) or the structures can be what are known as "eFuses" which simply provide a different electrical resistance value depending upon whether they are programmed (blown) or not.

The embodiments discussed below relate to fuse structures, such as eFuses and to improvements to such structures, as well as to methods for making such structures.

SUMMARY

One embodiment herein comprises an eFuse structure that has a pair of adjacent semiconducting fins projecting from the planar surface of a substrate (in a direction perpendicular to the planar surface). The fins have planar sidewalls (perpendicular to the planar surface of the substrate) and planar tops (parallel to the planar surface of the substrate). The tops are positioned at distal ends of the fins relative to the substrate. An insulating layer covers the tops and the sidewalls of the fins and covers an intervening substrate portion of the planar surface of the substrate located between the fins. A metal layer covers the insulating layer. A pair of conductive contacts are connected to the metal layer at locations where the metal layer is adjacent the top of the fins.

Another eFuse structure of embodiments herein also includes a pair of adjacent semiconducting fins projecting from the planar surface of a substrate (in a direction perpendicular to the planar surface). The fins have planar sidewalls (perpendicular to the planar surface of the substrate) and planar tops (parallel to the planar surface of the substrate). The tops are positioned at distal ends of the fins relative to the substrate. An insulating layer again covers the tops and the sidewalls of the fins and covers an intervening substrate portion of the planar surface of the substrate located between the fins. A metal layer covers the insulating layer. Silicide regions are connected to the metal layer at locations where the metal layer is adjacent the top of the fins, and a pair of conductive contacts are connected to the silicide regions.

A method for forming an eFuse structure herein comprises patterning a pair of adjacent semiconducting fins on a planar surface of a substrate. The fins project from the planar surface in a direction perpendicular to the planar surface, the fins have planar sidewalls perpendicular to the planar surface of the substrate and planar tops parallel to the planar surface of the substrate, the tops are positioned at distal ends of the fins relative to the substrate. This exemplary method then forms an insulating layer on the tops and the sidewalls of the fins and on an intervening substrate portion of the planar surface of the substrate located between the fins. This method forms a metal layer on the insulating layer and forms a pair of conductive contacts on the metal layer at locations where the metal layer is adjacent the top of the fins.

Another method for making an eFuse structure herein patterns a pair of adjacent semiconducting fins on a planar surface of a substrate. The fins again project from the planar surface in a direction perpendicular to the planar surface, and the fins have planar sidewalls perpendicular to the planar surface of the substrate and planar tops parallel to the planar surface of the substrate. The tops are positioned at distal ends of the fins relative to the substrate. This exemplary method forms an insulating layer on the tops and the sidewalls of the fins and on an intervening substrate portion of the planar surface of the substrate located between the fins. This method also forms a metal layer on the insulating layer. Then, the method forms silicide regions on the metal layer at locations where the metal layer is adjacent the top of the fins and forms a pair of conductive contacts on the silicide regions.

BRIEF DESCRIPTION OF THE SEVERAL VIEWS OF THE DRAWINGS

The embodiments of the invention will be better understood from the following detailed description with reference to the drawings, which are not necessarily drawing to scale and in which.

DETAILED DESCRIPTION

As mentioned above, fuse structures are useful for performing many functions within integrated circuit devices. Some fuse structures, such as eFuses, alter the resistance of the fuse link to program the eFuse. For example, in silicide eFuse links, excessive current can alter the silicide of the eFuse link to change the resistance value of the eFuse.

Further, advances in transistor technology utilize structures that are known as fin-type field effect transistors (FinFETs) that utilize high-k gate dielectrics and metal gates (HKMG) for performance improvements. For a brief overview of such devices see U.S. Patent Publication 2010/0301417, incorporated herein by reference. However, conventional silicide eFuses are not compatible with HKMG FinFET formation techniques because of the low resistance metal gate layer under the silicide of such HKMG FinFET devices. Furthermore, conventional silicide eFuses require program voltage much higher than standard complementary metal oxide semiconductor (CMOS) HKMG FinFET device operating voltage ranges.

Therefore, the embodiments herein provide eFuse structures that are compatible with HKMG FinFET formation processes and that can be programmed with a lower programming voltage appropriate for (CMOS) HKMG FinFET devices.

Figure 5:
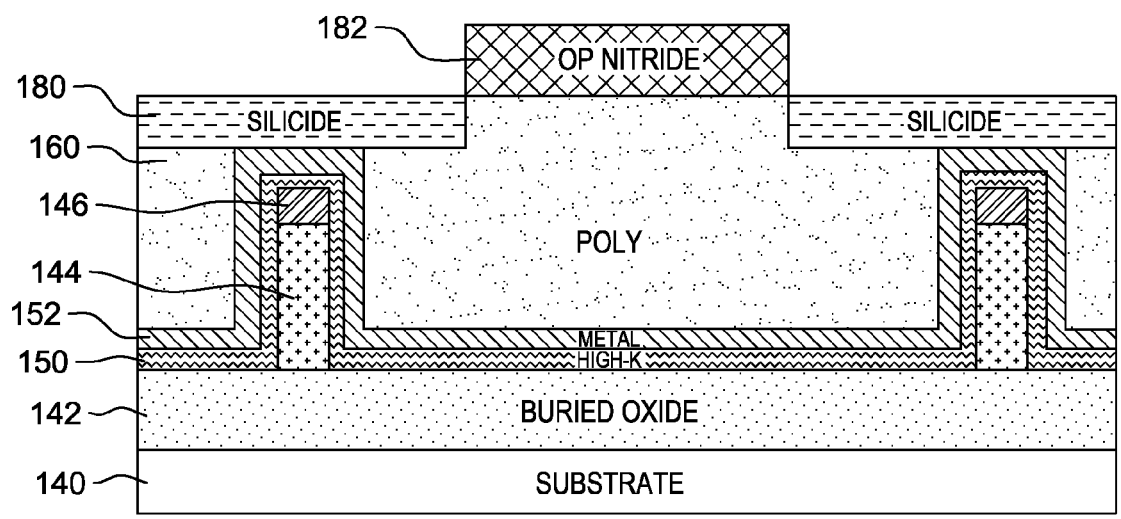
FIG. 5 is a schematic cross-sectional diagram of a structure according to embodiments herein.
Figure 6:
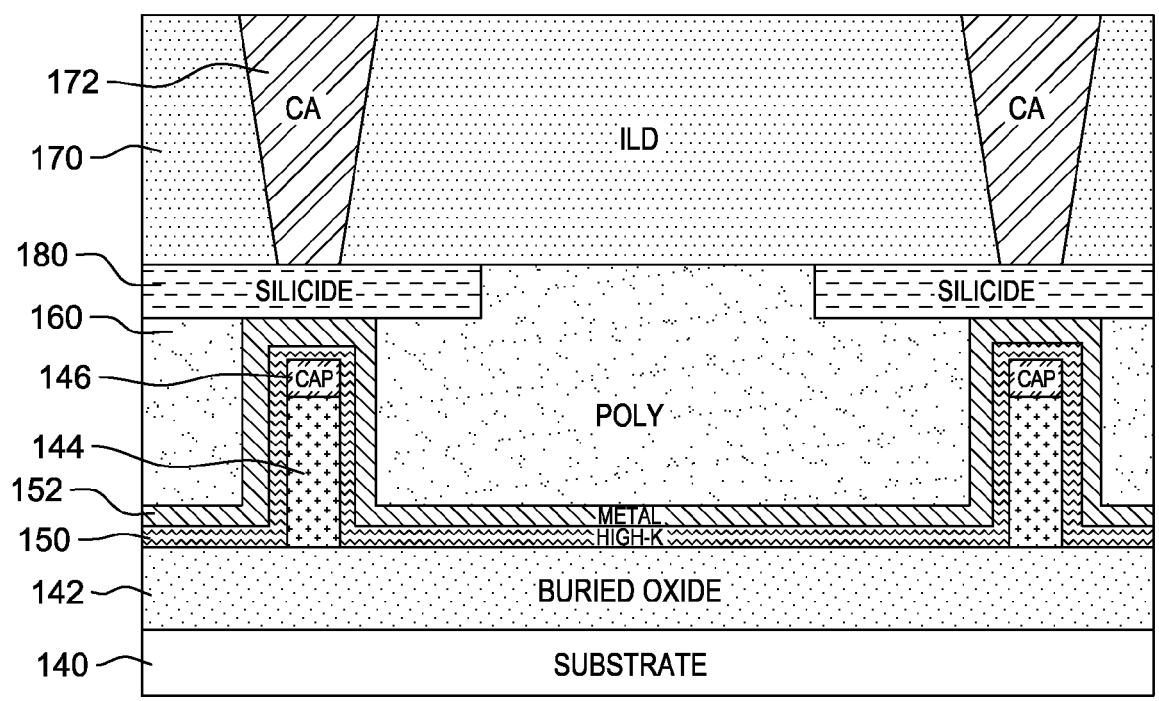
FIG. 6 is a schematic cross-sectional diagram of a structure according to embodiments herein.
Figure 7:
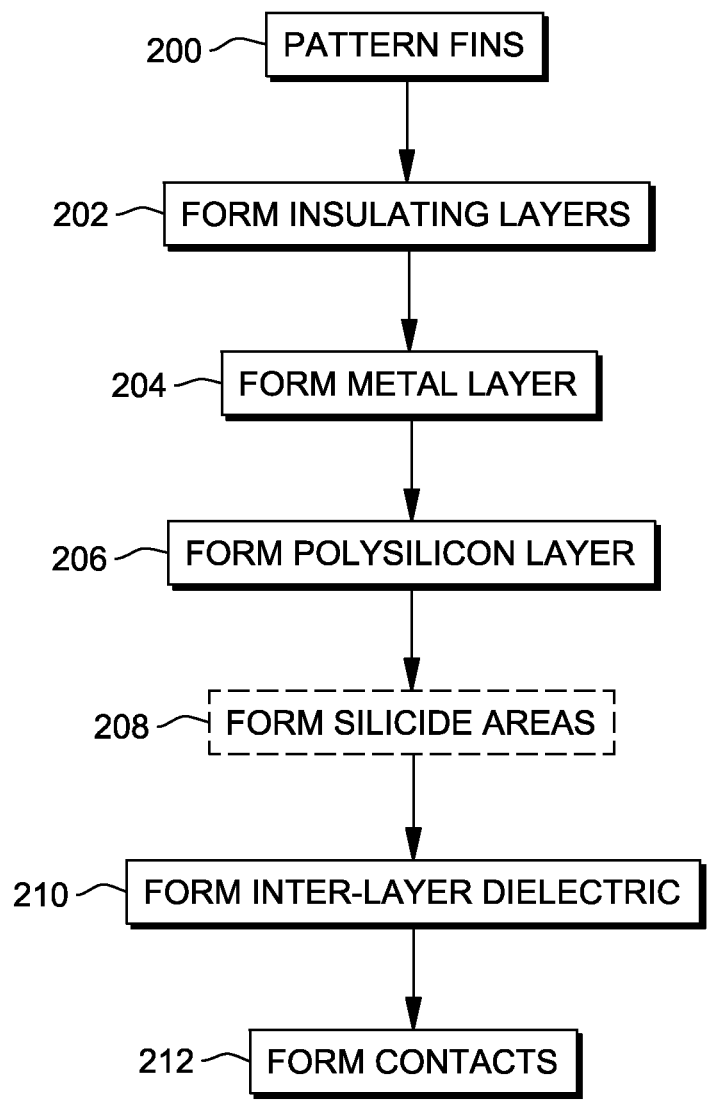
FIG. 7 is a flow diagram illustrating various embodiments herein.

As shown in cross-sectional view in FIGS. 1-6 and in flowchart form in FIG. 7, exemplary embodiments herein form various eFuse structures. In item 200 (FIG. 7), an exemplary method herein patterns a pair of adjacent semiconducting fins 144 on a planar surface of a buried oxide layer 142 of a substrate structure. Capping material is optionally used to form caps 146.

As would be understood by those ordinarily skilled in the art, one substrate structure that the fins 144 could be formed is a silicon-on-insulator (SOI) substrate that includes a substrate layer 140 and a buried oxide layer 142. The fins 144 are formed of a semiconductor and can be formed using many techniques, such as patterning, sidewall formation, etc.

A "substrate" herein can comprise any material appropriate for the given purpose (whether now known or developed in the future) and can comprise, for example, Si, SiC, SiGe, SiGeC, Ge alloys, GaAs, InAs, TnP, other III-V or II-VI compound semiconductors, or organic semiconductor structures, etc.

For purposes herein, a "semiconductor" is a material or structure that may include an implanted impurity that allows the material to sometimes be conductive and sometimes be a non-conductive, based on electron and hole carrier concentration. As used herein, "implantation processes" can take any appropriate form (whether now known or developed in the future) and can comprise, for example, ion implantation, etc.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of SiO2 and Si3N4, and metal oxides like tantalum oxide that have relative dielectric constants above that of SiO2 (above 3.9). The thickness of dielectrics herein may vary contingent upon the required device performance. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

When patterning any material herein, the material to be patterned can be grown or deposited in any known manner and a patterning layer (such as an organic photoresist) can be formed over the material. The patterning layer (resist) can be exposed to some form of light radiation (e.g., patterned exposure, laser exposure, etc.) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

For purposes herein, "sidewall structures" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as sidewall structures.

Figure 1:
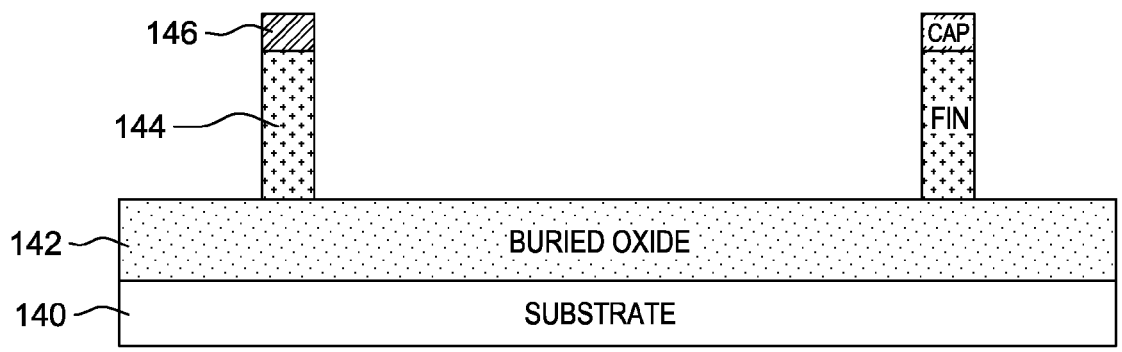
FIG. 1 is a schematic cross-sectional diagram of a structure according to embodiments herein.

As shown in FIG. 1, the fins 144 project from the planar surface of buried insulator 142 (e.g. buried oxide) in a direction perpendicular to the planar surface. The fins 144 have planar sidewalls that are perpendicular to the planar surface of the buried oxide layer 142 and planar tops that are parallel to the planar surface of the buried oxide layer 142. The tops are positioned at distal ends of the fins 144 relative to the buried oxide layer 142. The fins 144 are, therefore, rectangular boxes in shape and have a length (projecting outward from the drawing) that is longer than the height of the sidewalls of the fins 144. As shown, the fins are thin structures and, therefore, the top of the fins 144 is shorter than the height of the sidewalls of the fins 144. Alternatively, the fins 144 can be formed on a bulk semiconductor substrate.

Figure 2:
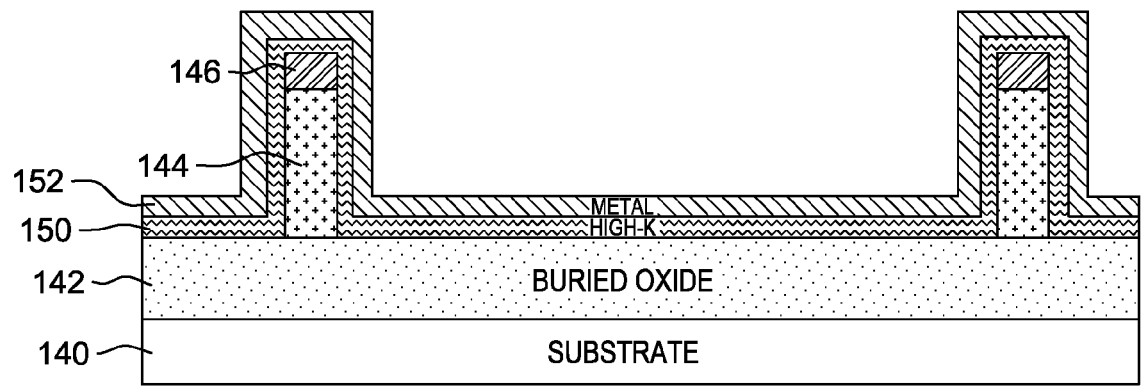
FIG. 2 is a schematic cross-sectional diagram of a structure according to embodiments herein.
Figure 3:
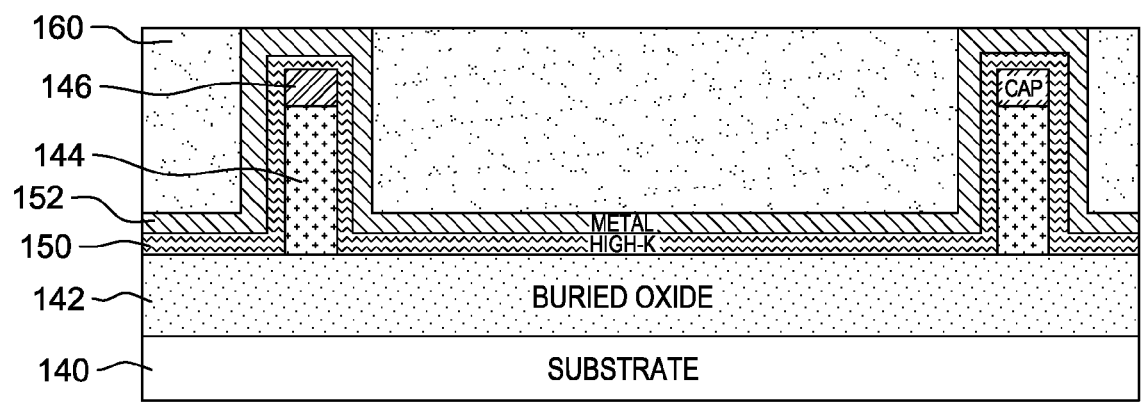
FIG. 3 is a schematic cross-sectional diagram of a structure according to embodiments herein.

As shown in FIG. 2, and in item 202 in FIG. 7, the methods herein form an insulating layer 150 on the tops and the sidewalls of the fins 144 and on an intervening portion of the planar surface of the buried oxide layer 142 located between the fins 144. In item 204, these methods also form a metal layer 152 on the insulating layer 150. Following this, as shown in FIG. 3, the methods herein form a conductor layer 160, such as polysilicon layer, over the metal layer 152 in item 206. The structure is then planarized using any conventional process such as chemical mechanical polishing (CMP).

Figure 4:
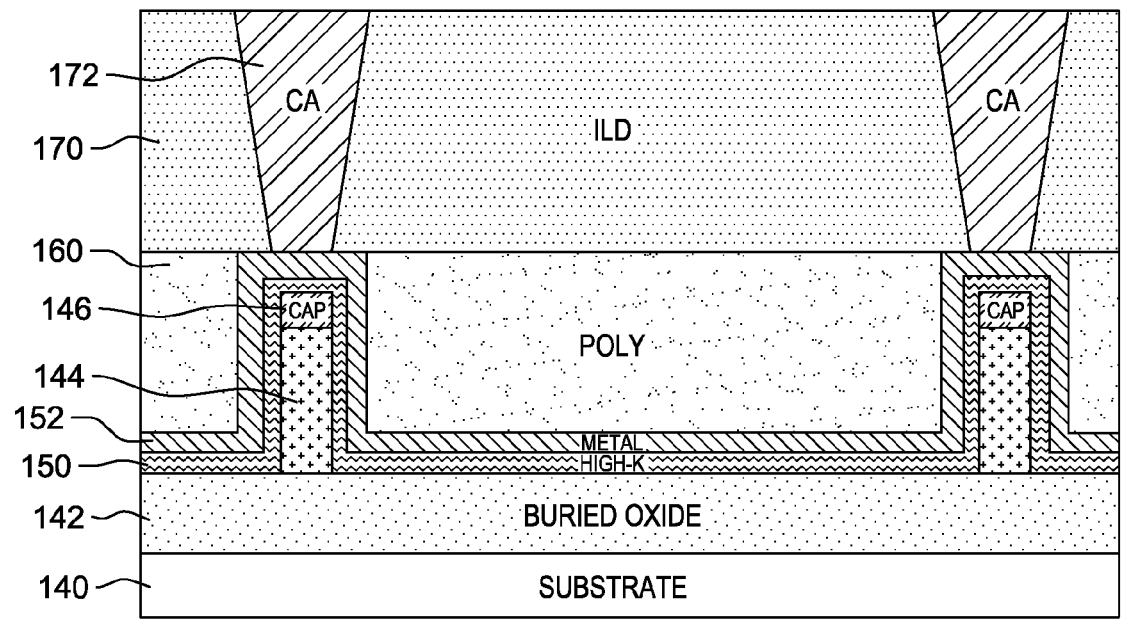
FIG. 4 is a schematic cross-sectional diagram of a structure according to embodiments herein.

As shown in FIG. 4, the electrical contacts 172 (which can be any of the conductors mentioned above) and inter-layer dielectric 170 are formed. The contacts 172 are formed at locations where the metal layer 152 is adjacent the top of the fins 144. These structures can be formed in any order, and FIG. 7 arbitrarily illustrates the inter-layer dielectric 170 being formed in item 210 and the contacts 172 being formed in item 212. Therefore, the contacts 172 can be patterned and the inter-layer dielectric 170 formed over the patterned contacts 172, or the inter-layer dielectric 170 can be formed on the polysilicon 160, openings can be patterned into the inter-layer dielectric 170, and the conductive contacts 172 can be deposited into the openings. The contacts 172 comprise the anode and cathode of the eFuse formed herein.

In some optional embodiments, shown in FIGS. 5-6 and in item 208 in FIG. 7, the method can form silicide regions 180 on the metal layer 152 at locations where the metal layer 152 is adjacent the top of the fins 144. To form such silicide regions 180, a protective material 182, such as a nitride, etc. is patterned over the polysilicon 160. A metal is deposited on the polysilicon 160 and nitride 182 and the structure is heated to cause the polysilicon to combine with the metal and form silicide regions 180. The nitride 182 is then removed and the inter-layer dielectric 170 and contacts 172 are formed, as discussed above, to produce the structure shown in FIG. 6.

As shown in FIGS. 4 and 6, the eFuse structures thus produced includes a pair of adjacent semiconducting fins 144 projecting from the planar surface of a buried oxide layer 142 (in a direction perpendicular to the planar surface). The fins 144 have planar sidewalls (perpendicular to the planar surface of the buried oxide layer 142) and planar tops (parallel to the planar surface of the buried oxide layer 142). The tops are positioned at distal ends of the fins 144 relative to the buried oxide layer 142. A conformal insulating layer 150 covers the tops and the sidewalls of the fins 144 and covers an intervening buried oxide layer 142 portion of the planar surface of the buried oxide layer 142 located between the fins 144. A metal layer 152 covers the insulating layer 150. As shown in FIG. 4, a pair of conductive contacts can be connected to the metal layer 152 at locations where the metal layer 152 is adjacent the top of the fins 144. As shown in FIG. 6, optional silicide regions 180 can be connected to the metal layer 152 at locations where the metal layer 152 is adjacent the top of the fins 144, and a pair of conductive contacts is connected to the silicide regions 180.

Therefore, the metal layer 152 is a fusible link having integral first and second contacts regions 172 on opposite ends of the fusible link. As would be understood by those ordinarily skilled in the art, the foregoing structures can be formed simultaneously with FinFET structures on the same substrate. Each of the silicon fins 144 could be formed simultaneously with a channel region of an individual FinFET, the conformal insulator 150 could be formed simultaneously with a gate dielectric, and the metal layer 152 and polysilicon 160 could be formed simultaneously with a gate conductor. The portions of the fins 144 that extend into and out of the two-dimensional cross-sectional drawings of FIGS. 1-6 would comprise the source and drain regions of such transistors. When the fuse is programmed (electric current flowing through the fuse), current crowding occurs at the corner between the fin and the substrate. Current crowding beneficially reduces the fuse programming voltage, rendering the inventive fuse suitable for low voltage application.

The resulting structure can be included within integrated circuit chips, which can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit the invention because, as would be understood by those ordinarily skilled in the art, the invention is applicable to structures that include many of each type of transistor shown in the drawings.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An eFuse structure comprising:
   a substrate having a planar surface;
   a pair of adjacent semiconducting fins projecting from said planar surface of said substrate in a direction perpendicular to said planar surface, said fins having planar sidewalls perpendicular to said planar surface of said substrate and planar tops parallel to said planar surface of said substrate, said tops being positioned at distal ends of said fins relative to said substrate;
   an insulating layer covering said tops and said sidewalls of said fins and covering an intervening substrate portion of said planar surface of said substrate located between said fins;
   a metal layer covering said insulating layer; and
   a pair of conductive contacts connected to said metal layer at locations where said metal layer is adjacent said top of said fins.

2. The eFuse structure according to claim 1, said sidewalls and said tops of said fins forming right-angle corners, and said sidewalls of said fins and said intervening substrate portion forming right angle corners.

3. The eFuse structure according to claim 1, further comprising a polysilicon layer on said metal layer, said conductive contacts extending through said polysilicon layer to contact said metal layer.

4. The eFuse structure according to claim 1, further comprising a dielectric layer on said polysilicon layer, said conductive contacts extending through said dielectric layer.

5. The eFuse structure according to claim 1, said substrate comprising an insulator.

6. The eFuse structure according to claim 1, said insulating layer comprising a conformal material having a dielectric constant above 3.9.

7. An eFuse structure comprising:
   a substrate having a planar surface;
   a pair of adjacent semiconducting fins projecting from said planar surface of said substrate in a direction perpendicular to said planar surface, said fins having planar sidewalls perpendicular to said planar surface of said substrate and planar tops parallel to said planar surface of said substrate, said tops being positioned at distal ends of said fins relative to said substrate;
   an insulating layer covering said tops and said sidewalls of said fins and covering an intervening substrate portion of said planar surface of said substrate located between said fins;

a metal layer covering said insulating layer;

silicide regions connected to said metal layer at locations where said metal layer is adjacent said top of said fins; and a pair of conductive contacts connected to said silicide regions.

8. The eFuse structure according to claim 7, said sidewalls and said tops of said fins forming right-angle corners, and said sidewalls of said fins and said intervening substrate portion forming right angle corners.

9. The eFuse structure according to claim 7, further comprising a polysilicon layer on said metal layer, said conductive contacts extending through said polysilicon layer to contact said metal layer.

10. The eFuse structure according to claim 9, further comprising a dielectric layer on said polysilicon layer, said conductive contacts extending through said dielectric layer.

11. The eFuse structure according to claim 7, said substrate comprising an insulator.

12. The eFuse structure according to claim 7, said insulating layer comprising a conformal material having a dielectric constant above 3.9.

13. A method for forming an eFuse structure comprising:

patterning a pair of adjacent semiconducting fins on a planar surface of a substrate, said fins projecting from said planar surface in a direction perpendicular to said planar surface, said fins having planar sidewalls perpendicular to said planar surface of said substrate and planar tops parallel to said planar surface of said substrate, said tops being positioned at distal ends of said fins relative to said substrate;

forming an insulating layer on said tops and said sidewalls of said fins and on an intervening substrate portion of said planar surface of said substrate located between said fins;

forming a metal layer on said insulating layer; and forming a pair of conductive contacts on said metal layer at locations where said metal layer is adjacent said top of said fins.

14. The method for forming an eFuse structure according to claim 13, said patterning of said fins being performed such that said sidewalls and said tops of said fins form right-angle corners, and said sidewalls of said fins and said intervening substrate portion form right angle corners.

15. The method for forming an eFuse structure according to claim 13, further comprising forming a polysilicon layer on said metal layer, said conductive contacts extending through said polysilicon layer to contact said metal layer.

16. The method for forming an eFuse structure according to claim 15, further comprising forming a dielectric layer on said polysilicon layer, said conductive contacts extending through said dielectric layer.

17. The method for forming an eFuse structure according to claim 13, said substrate comprising an insulator.

18. The method for forming an eFuse structure according to claim 13, said insulating layer comprising a conformal material having a dielectric constant above 3.9.

19. A method for forming an eFuse structure comprising:

patterning a pair of adjacent semiconducting fins on a planar surface of a substrate, said fins projecting from said planar surface in a direction perpendicular to said planar surface, said fins having planar sidewalls perpendicular to said planar surface of said substrate and planar tops parallel to said planar surface of said substrate, said tops being positioned at distal ends of said fins relative to said substrate;

forming an insulating layer on said tops and said sidewalls of said fins and on an intervening substrate portion of said planar surface of said substrate located between said fins;

forming a metal layer on said insulating layer;

forming silicide regions on said metal layer at locations where said metal layer is adjacent said top of said fins; and forming a pair of conductive contacts on said silicide regions.

20. The method for forming an eFuse structure according to claim 19, said patterning of said fins being performed such that said sidewalls and said tops of said fins form right-angle corners, and said sidewalls of said fins and said intervening substrate portion form right angle corners.

21. The method for forming an eFuse structure according to claim 19, further comprising forming a polysilicon layer on said metal layer, said conductive contacts extending through said polysilicon layer to contact said metal layer.

22. The method for forming an eFuse structure according to claim 21, further comprising forming a dielectric layer on said polysilicon layer, said conductive contacts extending through said dielectric layer.

23. The method for forming an eFuse structure according to claim 19, said substrate comprising an insulator.

24. The method for forming an eFuse structure according to claim 19, said insulating layer comprising a conformal material having a dielectric constant above 3.9.

* * * * *